United States Patent
Kishi et al.

(10) Patent No.: US 12,009,174 B2
(45) Date of Patent: Jun. 11, 2024

(54) DRAWING APPARATUS AND DEFLECTOR

(71) Applicant: NUFLARE TECHNOLOGY, INC., Yokohama (JP)

(72) Inventors: Kazuhiro Kishi, Yokohama (JP); Munehiro Ogasawara, Hiratsuka (JP)

(73) Assignee: NUFLARE TECHNOLOGY, INC., Yokohama (JP)

( * ) Notice: Subject to any disclaimer, the term of this patent is extended or adjusted under 35 U.S.C. 154(b) by 280 days.

(21) Appl. No.: 17/651,278

(22) Filed: Feb. 16, 2022

(65) Prior Publication Data

US 2022/0172919 A1    Jun. 2, 2022

Related U.S. Application Data

(63) Continuation of application No. PCT/JP2020/031271, filed on Aug. 19, 2020.

(30) Foreign Application Priority Data

Aug. 20, 2019    (JP) ................................. 2019-150251

(51) Int. Cl.
*H01J 37/04*    (2006.01)
*H01J 37/26*    (2006.01)
*H01J 37/317*    (2006.01)

(52) U.S. Cl.
CPC ........ *H01J 37/045* (2013.01); *H01J 37/3174* (2013.01); *H01J 37/26* (2013.01); *H01J 2237/0435* (2013.01)

(58) Field of Classification Search
CPC .......... H01J 37/04; H01J 37/045; H01J 37/26; H01J 37/3174; H01J 37/3175;
(Continued)

(56) References Cited

U.S. PATENT DOCUMENTS 6,268,606 B1    7/2001    Abe et al.
8,148,698 B2    4/2012    Nishiyama
(Continued)

FOREIGN PATENT DOCUMENTS

JP    09-139184 A    5/1997
JP    11-150055 A    6/1999
(Continued)

OTHER PUBLICATIONS

International Search Report dated Nov. 10, 2020 in PCT/JP2020/031271 filed on Aug. 19, 2020, 2 pages.
(Continued)

*Primary Examiner* — Sean M Luck
(74) *Attorney, Agent, or Firm* — Oblon, McClelland, Maier & Neustadt, L.L.P.

(57) ABSTRACT

A blanking deflector according to an embodiment includes: a first electrode comprising a first insulator, a first material film coating all surfaces of the first insulator and having lower resistance than the first insulator, and a first low-resistance film coating part or all of surfaces of the first material film and having lower resistance than the first material film; and a second electrode comprising a second insulator, a second material film coating all surfaces of the second insulator and having lower resistance than the second insulator, and a second low-resistance film coating part or all of surfaces of the second material film and having lower resistance than the second material film, wherein the blanking deflector controls whether to irradiate a specimen with a charged particle beam by causing the charged particle beam to pass between the first electrode and the second electrode.

18 Claims, 4 Drawing Sheets

(58) Field of Classification Search
CPC ........... H01J 37/3177; H01J 2237/0435; H01J 2237/0437
See application file for complete search history.

(56) References Cited

U.S. PATENT DOCUMENTS

| | | | |
|---|---|---|---|
| 9,530,616 | B2 | 12/2016 | Yamashita et al. |
| 9,991,086 | B2 | 6/2018 | Morita |
| 10,784,073 | B2 | 9/2020 | Ogasawara |
| 2005/0035300 | A1* | 2/2005 | Iwasaki ............... B82Y 10/00 250/492.2 |
| 2010/0237261 | A1 | 9/2010 | Nishiyama |
| 2010/0276606 | A1* | 11/2010 | Baars ................. B82Y 40/00 250/396 R |
| 2018/0166248 | A1 | 6/2018 | Ogasawara |

FOREIGN PATENT DOCUMENTS

| | | |
|---|---|---|
| JP | 11-273603 A | 10/1999 |
| JP | 2000-011937 A | 1/2000 |
| JP | 2000-106117 A | 4/2000 |
| JP | 2002-100317 A | 4/2002 |
| JP | 2006-108119 A | 4/2006 |
| JP | 2006-185637 A | 7/2006 |
| JP | 2007-080903 A | 3/2007 |
| JP | 2008-042049 A | 2/2008 |
| JP | 2010-225728 A | 10/2010 |
| JP | 5548375 A | 5/2014 |
| JP | 2016-076548 A | 5/2016 |
| JP | 2017-126674 A | 7/2017 |
| JP | 2018-098268 A | 6/2018 |

OTHER PUBLICATIONS

Japanese Office Action dated Feb. 17, 2023 in Japanese Patent Application No. 2019-150251 (with unedited computer-generated English Translation), 4 pages.

Office Action issued Jan. 12, 2024, in Korean Patent Application No. 10-2022-7005701, w/English-language Translation, citing document numbers 15 and 16.

* cited by examiner

DRAWING APPARATUS AND DEFLECTOR

CROSS REFERENCE TO RELATED APPLICATIONS

This application is based upon and claims the benefit of priority from the prior Japanese Patent Application No. 2019-150251, filed on Aug. 20, 2019 and the prior International Patent Application No. PCT/JP2020/031271, filed on Aug. 19, 2020, the entire contents of which are incorporated herein by reference.

FIELD

The embodiments of the present invention relate to a drawing apparatus and deflector.

BACKGROUND

A drawing apparatus draws a desired pattern on a mask blanks by irradiating the mask blanks with a charged particle beam emitted from an electron gun. The drawing apparatus sometimes causes the charged particle beam to pass through a shaping aperture array to be shaped into multibeam.

The irradiation amounts of multibeam are controlled individually or collectively. A blanker and a blanking aperture array are provided to execute individual blanking control of the multibeam. The blanking aperture array blocks beams deflected by the blanker and causes undeflected beams to pass. Separately from the individual control of the multibeam, a blanking deflector and a blanking aperture are provided to execute blanking control of the entire multibeam. The blanking aperture blocks the entire multibeam when the multibeam is deflected by the blanking deflector, or causes the entire multibeam to pass when the multibeam is not deflected.

Generally, the blanking deflector causes the entire multibeam to pass between a plurality of electrodes to deflect the multibeam. However, in order to execute blanking control of beams having such a large diameter as the multibeam, the electrodes of the blanking deflector need to be enlarged. However, it is difficult to uniformly deposit a thin metallic film on a base material of the electrodes having a large surface area and the film thickness of the metallic film sometimes varies. If the film thickness of the metallic film of the electrodes varies, the magnitude of a magnetic field changes at the time of a high-frequency operation and at the time of a low-frequency operation due to the effect of an eddy current. This destabilizes the deflection angles of beams at the time of a high-frequency operation and at the time of a low-frequency operation, which leads to beam drift. As a result, the deflection accuracy of multibeam is deteriorated.

Meanwhile, thinning of the film thickness of the metallic film of the electrodes is conceivable to suppress the eddy current. In this case, however, a problem occurs that the base material is charged up due to the beams and the drawing accuracy is deteriorated if the base material is exposed due to variation in the film thickness.

SUMMARY

A blanking deflector according to an embodiment includes: a first electrode comprising a first insulator, a first material film coating all surfaces of the first insulator and having lower resistance than the first insulator, and a first low-resistance film coating part or all of surfaces of the first material film and having lower resistance than the first material film; and a second electrode comprising a second insulator, a second material film coating all surfaces of the second insulator and having lower resistance than the second insulator, and a second low-resistance film coating part or all of surfaces of the second material film and having lower resistance than the second material film, wherein the blanking deflector controls whether to irradiate a specimen with a charged particle beam by causing the charged particle beam to pass between the first electrode and the second electrode.

A charged particle beam apparatus according to an embodiment includes: a beam irradiation part configured to generate a charged particle beam to be emitted to a specimen; and a first deflector comprising a first electrode and a second electrode and configured to cause a charged particle beam to be emitted to a specimen to pass between the first electrode and the second electrode and control whether to irradiate the specimen with the charged particle beam, wherein the first electrode comprises a first insulator, a first material film coating all surfaces of the first insulator and having lower resistance than the first insulator, and a first low-resistance film coating part or all of surfaces of the first material film and having lower resistance than the first material film, and the second electrode comprises a second insulator, a second material film coating all surfaces of the second insulator and having lower resistance than the second insulator, and a second low-resistance film coating part or all of surfaces of the second material film and having lower resistance than the second material film.

DETAILED DESCRIPTION

Figure 1:
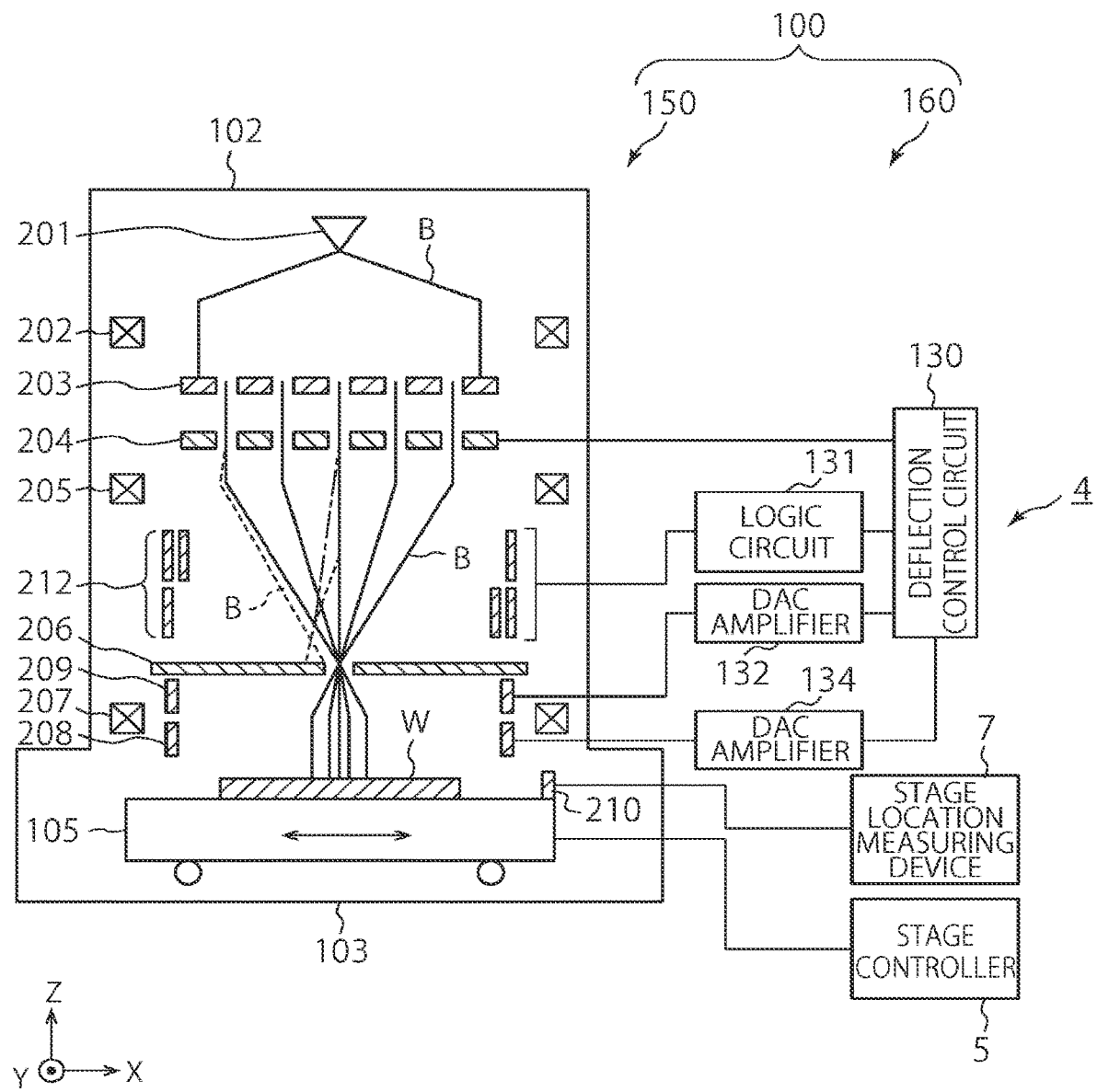
FIG. 1 is a diagram illustrating a configuration example of a drawing apparatus according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

First Embodiment

FIG. 1 is a diagram illustrating a configuration example of a drawing apparatus according to a first embodiment. A drawing apparatus 100 is, for example, a charged-particle beam exposure apparatus according to a multibeam system and is used to draw a photomask or a template for lithography used in manufacturing of a semiconductor device. The present embodiment may be applied to an apparatus that irradiates a specimen W with an electron beam or an ion beam of an exposure apparatus, an electron microscope, or the like, as well as to the drawing apparatus. Therefore, the specimen W being a processing target may be a semiconductor substrate or the like, as well as a mask blanks.

The drawing apparatus 100 includes a drawing part 150 and a controller 160. The drawing part 150 includes an electron lens barrel 102 and a drawing chamber 103. The controller 160 includes an irradiation controller 4, a stage controller 5, and a stage location measuring device 7.

An electron gun 201, an illuminating lens 202, a shaping aperture array substrate 203, a blanking aperture array mechanism 204, a reducing lens 205, a limiting aperture substrate 206, an objective lens 207, a main deflector 208, a sub deflector 209, and a blanking deflector 212 are placed in the electron lens barrel 102. A stage 105 capable of moving in an X direction and a Y direction that are orthogonal to each other is placed in the drawing chamber 103. The stage 105 can have mounted thereon the specimen W such as a mask blanks being a processing target at the time of drawing. The specimen W is, for example, a mask blanks having a light-shielding film such as chrome and a resist film stacked on a glass substrate. A mirror 210 is placed on the stage 105 to measure the location of the stage 105. A vacuum is drawn inside the electron lens barrel 102 and the drawing chamber 103 to produce a depressurized state.

The electron gun 201 being a beam irradiation part generates a charged particle beam B. The charged particle beam (hereinafter, also simply "beam") B is, for example, an electron beam or an ion beam. The specimen W is irradiated with the beam B generated by the electron gun 201.

The blanking aperture array mechanism 204 includes a plurality of individual blankers that individually execute ON/OFF control of corresponding beams having passed through the shaping aperture array substrate 203, and performs blanking deflection with respect to each beam.

The blanking deflector 212 that executes blanking control of the entire multibeam in a lump is provided below the blanking aperture array mechanism 204. The limiting aperture substrate 206 having a hole formed at a central portion is provided below the blanking deflector 212. Electron beams deflected so as to be in a beam-OFF state by the blanking aperture mechanism 204 or the blanking deflector 212 are displaced from the hole at the center of the limiting aperture substrate 206 and are blocked by the limiting aperture substrate 206. Electron beams not having been deflected by the blanking aperture mechanism 204 or the blanking deflector 212 pass through the limiting aperture substrate 206 and are deflected by the deflectors 208 and 209 to be emitted to desired locations on the specimen W as a substrate.

The stage controller 5 controls the stage 105 to move in the X direction or the Y direction.

The stage location measuring device 7 includes, for example, a laser length meter and irradiates the mirror 210 fixed on the stage 105 with laser light to measure the location in the X direction of the stage 105 using reflected light. An identical configuration to the stage location measuring device 7 and the mirror 210 is provided also in the Y direction as well as in the X direction and measures also the location in the Y direction of the stage 105.

In FIG. 1, configurations required for explaining the first embodiment are illustrated. The drawing apparatus 100 can be provided with other required configurations.

The drawing apparatus 100 performs a drawing operation by a raster scan method in which shot beams are continuously and sequentially emitted while the stage 105 is moved and, when a desired pattern is to be drawn, required beams according to the pattern are controlled to be brought to a beam-ON state by the blanking control.

Figure 2:
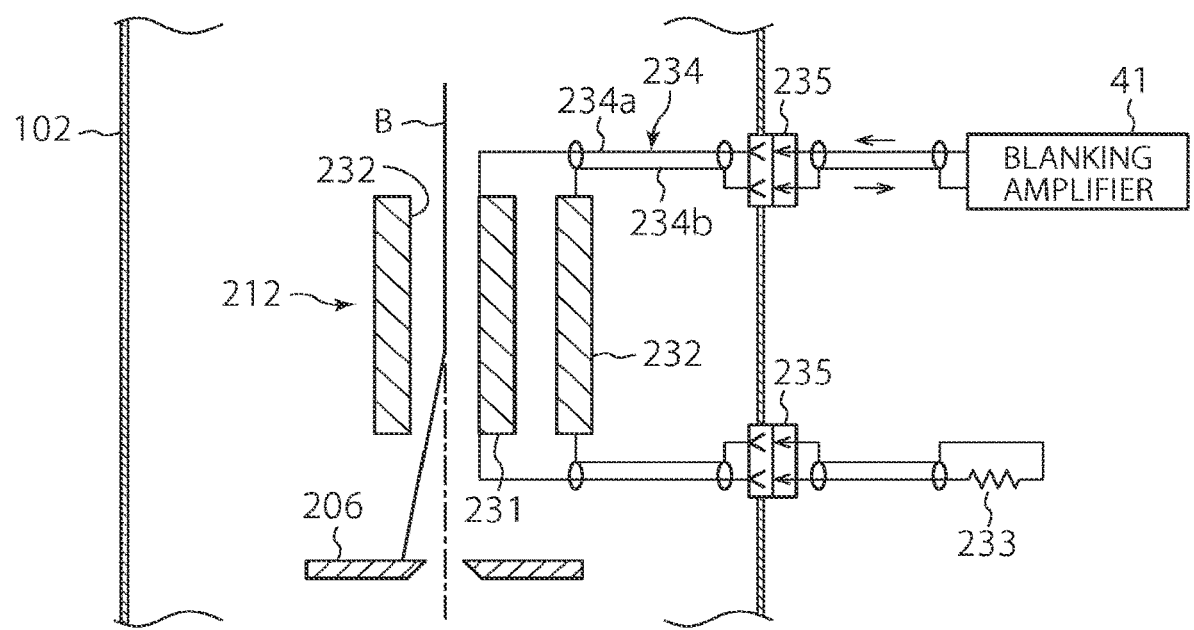
FIG. 2 is a sectional view illustrating a configuration example of the blanking deflector.

FIG. 2 is a sectional view illustrating a configuration example of the blanking deflector 212. The blanking deflector 212 being a first deflector includes a first electrode 231 and a second electrode 232. The blanking deflector 212 causes the beam B to pass between the first electrode 231 and the second electrode 232 to deflect the beam B. Accordingly, the blanking deflector 212 can control the beam B to be emitted or not to be emitted to the specimen W.

The first electrode 231 is an electrode having a plate shape or a rod shape and a positive or negative voltage is applied thereto. The second electrode 232 is an electrode having a tubular shape encompassing the first electrode 231 and a different voltage (for example, a ground voltage) from that of the first electrode 231 is applied thereto. Since having a tubular shape encompassing the first electrode 231, the second electrode 232 is seen on the both sides of the first electrode 231 on a vertical cross section in FIG. 2. The beam B passes inside the second electrode 232. At that time, the beam B passes between the inner side surface of the second electrode 232 and the outer side surface of the first electrode 231 and is subjected to an electric field and a magnetic field according to a difference between the voltages applied to the first and second electrodes 231 and 232. Therefore, when there is little voltage difference between the first electrode 231 and the second electrode 232, the beam B is not deflected and passes through an opening of the limiting aperture substrate 206 to be emitted to the specimen W. On the other hand, when there is a voltage difference between the first electrode 231 and the second electrode 232, the beam B is deflected and is blocked by the limiting aperture substrate 206. In this way, the blanking deflector 212 executes the blanking control of the beam B. More detailed configurations of the first and second electrodes 231 and 232 will be explained later with reference to FIGS. 3A and 3B.

One ends (for example, lower ends) of the first electrode 231 and the second electrode 232 are electrically connected to a resistive element 233 located outside the electron lens barrel 102 via a connector 235. The other ends (for example, upper ends) of the first electrode 231 and the second electrode 232 are electrically connected to a core (a signal line) 234a and a shield (a ground line) 234b of a coaxial cable 234, respectively. The signal line 234a and the ground line 234b are electrically connected to a blanking amplifier 41 via a connector 235. Accordingly, the blanking amplifier 41 can apply an electric field and a magnetic field to the beam B passing between the first electrode 231 and the second electrode 232 by applying a current from the first electrode 231 to the second electrode 232 via the resistive element 233. A voltage applied to the signal line 234a (that is, a voltage applied to the first electrode 231) may be either a positive voltage or a negative voltage.

Figure 3A:
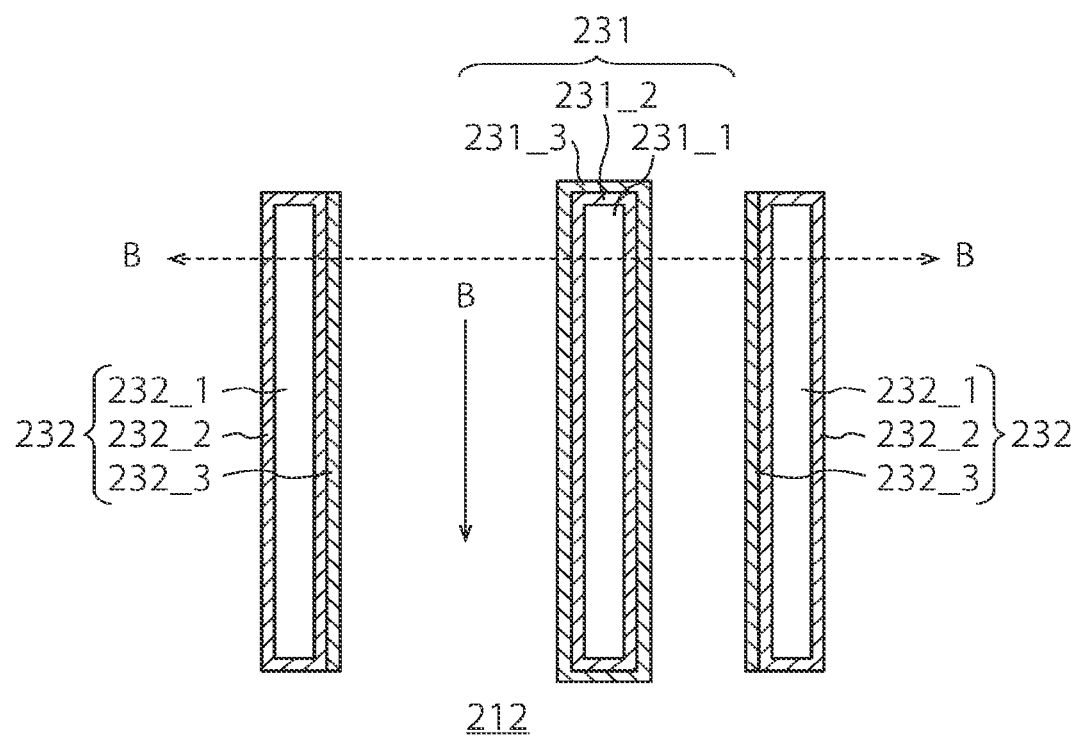
FIGS. 3A and 3B are sectional views illustrating the more detailed configurations of the first and second electrodes.
Figure 3B:
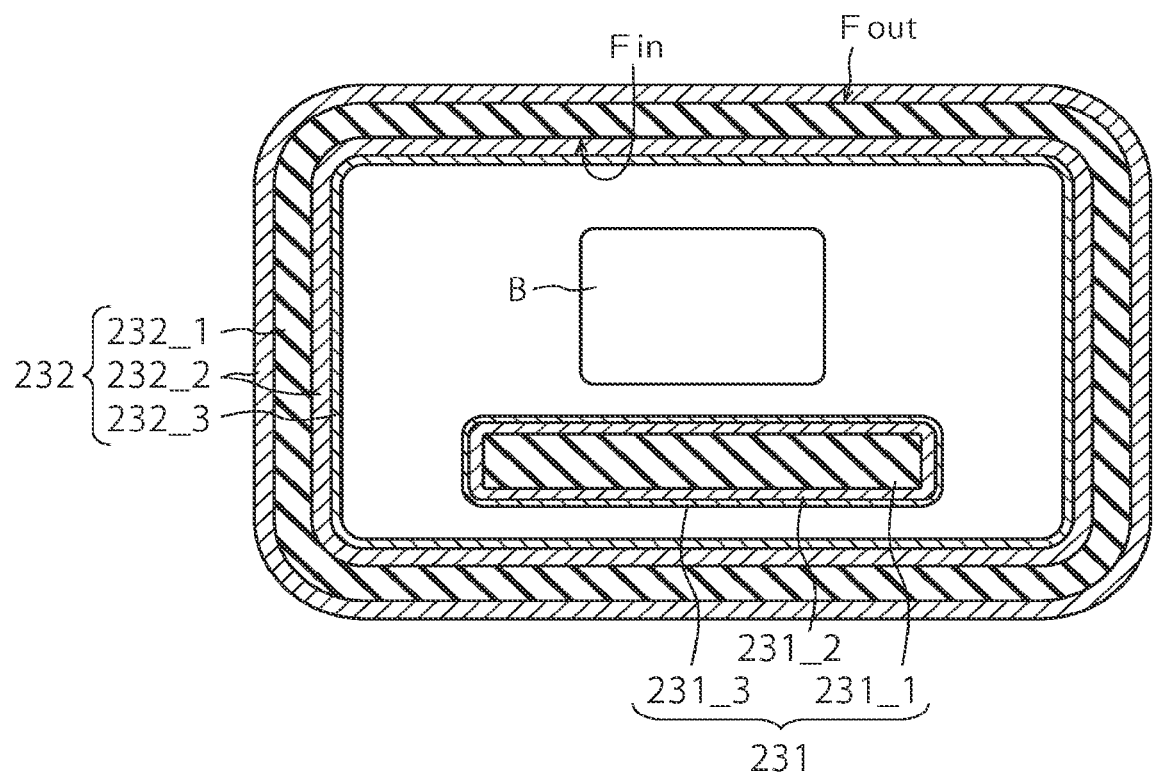

FIGS. 3A and 3B are sectional views illustrating the more detailed configurations of the first and second electrodes 231 and 232. FIG. 3B illustrates a cross section along a line B-B in FIG. 3A. That is, FIG. 3A illustrates a cross section along a traveling direction of the beam B and FIG. 3B illustrates a cross section along a direction substantially perpendicular to the traveling direction of the beam B.

The first electrode 231 includes a base material 231_1, a first material film 231_2, and a first low-resistance film 231_3. The base material 231_1 being a first insulator is formed of a nonconductive insulating material and is, for example, formed of aluminium oxide (alumina). The base material 231_1 has a rod-like or a plate-like shape.

The first material film 231_2 substantially coats the base material 231_1 and is formed of a material having a lower resistance than the base material 231_1. The first material film 231_2 is preferably a material that can be easily deposited on surfaces of the base material 231_1. Such a first material film 231_2 can be deposited on the surfaces of the base material 231_1, for example, using vacuum deposition or sputtering. The first material film 231_2 is formed of a material relatively high in the resistance while being not an insulating material and having a certain level of conductivity. The first material film 231_2 is considered to be capable of suppressing charge-up, for example, when formed of a material having a resistance value equal to or lower than the resistance value (for example, $10^6$ ohms ($\Omega$)) of an antistatic agent (a conductive polymer) to be used in electron lithography. More specifically, the first material film 231_2 is formed of, for example, any of materials such as carbon (C), titanium (Ti), and titanium nitride (TiN). The first material film 231_2 is preferably a non-magnetic material considering influences on charged particle radiation.

The first material film 231_2 substantially coats all surfaces of the base material 231_1 to prevent the base material 231_1 from being exposed. Depending on the roughness of the surfaces of the base material 231_1, the film thickness of the first material film 231_2 is preferably, for example, equal to or larger than 0.3 micrometer ($\mu$m) to coat all the surfaces of the base material 231_1. This can suppress charge-up with the beam B due to exposure of the base material 231_1.

The first low-resistance film 231_3 coats the surfaces of the base material 231_1 with the first material film 231_2 interposed therebetween and is formed of a material lower in the resistance than the first material film 231_2. To suppress beam drift due to oxidation and alteration of the first low-resistance film 231_3, the first low-resistance film 231_3 is preferably formed of, for example, a low-resistance precious metal material such as gold, platinum, cupper or aluminium. Such a first low-resistance film 231_3 is deposited on surfaces of the first material film 231_2, for example, using vacuum deposition or sputtering.

The first low-resistance film 231_3 is provided on the first material film 231_2 provided substantially on all the surfaces of the base material 231_1. However, since the first material film 231_2 substantially coats all the surfaces of the base material 231_1, the first low-resistance film 231_3 may coat part or all of the surfaces of the first material film 231_2 without considering charge-up. For example, the first low-resistance film 231_3 may be provided only on surfaces of the base material 231_1 facing the second electrode 232. When the first electrode 231 has a plate shape, the first low-resistance film 231_3 can be provided on both side surfaces of the base material 231_1. In this case, to enable the blanking amplifier 41 to supply power to the first low-resistance film 231_3, both the first low-resistance films 231_3 provided on the both side surfaces of the base material 231_1 are electrically connected to the signal line 234a.

The second electrode 232 includes a base material 232_1, a second material film 232_2, and a second low-resistance film 232_3. The base material 232_1 being a second insulator is formed of a nonconductive insulating material and is formed of, for example, aluminium oxide (alumina), similarly to the base material 231_1. The base material 232_1 has a tubular (cylindrical or substantially rectangular tube) shape as illustrated in FIG. 3B.

The second material film 232_2 substantially coats all surfaces of the base material 232_1 and is formed of a material having a lower resistance than the base material 232_1. The second material film 232_2 is preferably a material that can be easily deposited on the surfaces of the base material 232_1. Such a second material film 232_2 can be deposited on the surfaces of the base material 232_1, for example, using vacuum deposition or sputtering. The second material film 232_2 is formed of a material relatively high in the resistance while being not an insulating material and having a certain level of conductivity. The second material film 232_2 is considered to be capable of suppressing charge-up, for example, when formed of a material having a resistance value equal to or lower than the resistance value (for example, $10^6\Omega$) of an antistatic agent (a conductive polymer) to be used in the electron lithography. More specifically, the second material film 232_2 is formed of any of materials such as carbon (C), titanium (Ti), and titanium nitride (TiN) similarly to the first material film 231_2. The second material film 232_2 is preferably a non-magnetic material considering influences on charged particle radiation.

The second material film 232_2 coats the surfaces of the base material 232_1 to prevent the base material 232_1 from being exposed. Depending on the roughness of the surfaces of the base material 232_1, the film thickness of the second material film 232_2 is preferably, for example, equal to or larger than 0.3 $\mu$m to substantially coat all the surfaces of the base material 232_1. This can suppress charge-up with the beam B due to exposure of the base material 232_1.

The second low-resistance film 232_3 coats the surfaces of the base material 232_1 with the second material film 232_2 interposed therebetween and is formed of a material lower in the resistance than the second material film 232_2. To suppress oxidation and alteration of the second low-resistance film 232_3, the second low-resistance film 232_3 is preferably formed of, for example, a low-resistance precious metal material such as gold, platinum, cupper or aluminium similarly to the first low-resistance film 231_3. Such a second low-resistance film 232_3 is deposited on surfaces of the second material film 232_2, for example, using vacuum deposition or sputtering.

The second low-resistance film 232_3 is provided on the second material film 232_2 located on the surfaces of the base material 232_1. However, since the second material film 232_2 suppresses charge-up of the base material 232_1, it suffices that the second low-resistance film 232_3 coats part or all of the surfaces of the second material film 232_2. For example, the second low-resistance film 232_3 may be provided only on an inner side surface Fin of the base material 232_1 facing the first electrode 231 as illustrated in FIG. 3B. In this case, the second low-resistance film 232_3 is not provided on an outer side surface Fout of the base material 231_1 on the opposite side to the inner side surface Fin. The second low-resistance film 232_2 provided on the inner side surface Fin of the base material 232_1 is electrically connected to the ground line 234b. This enables the blanking amplifier 41 to apply the ground voltage to the second low-resistance film 232_3.

In a case in which the second low-resistance film 232_3 is to be deposited only on the inner side surface Fin of the base material 232_1, it suffices to mask the outer side surface Fout of the base material 231_1 using the lithography or the like, and thereafter selectively deposit the second low-resistance film 232_3 on surfaces of the second material film 232_2 on the inner side surface Fin using the vacuum deposition, sputtering, or the like.

When it is difficult to perform vacuum deposition or sputtering on the inner side surface Fin of the base material 232_1, the second material film 232_2 may be formed dividedly and the vacuum deposition or sputtering may be performed. The second low-resistance film 232_3 can be selectively deposited on the surfaces of the second material film 232_2 on the inner side surface Fin using the vacuum deposition, sputtering, or the like after the outer side surface Fout of the base material 231_1 is masked.

(Consideration Based on Skin Effect of High-Frequency Signal)

When the blanking deflector 212 is operated on a high-frequency signal (for example, a high-frequency pulse signal equal to or higher than 1 GHz) to execute blanking control of the beam B at a high speed, the current flows near surfaces on opposing faces of the first electrode 231 and the second electrode 232 due to the skin effect. In the present embodiment, the first low-resistance film 231_3 and the second low-resistance film 232_3 are provided on the opposing faces of the first electrode 231 and the second electrode 232 as illustrated in FIGS. 3A and 3B. In the present embodiment, the film thicknesses of the first low-resistance film 231_3 and the second low-resistance film 232_3 are set to cause the current due to the skin effect to pass through the whole of the first low-resistance film 231_3 and the second low-resistance film 232_3.

A depth d of a conductor through which the current passes due to the skin effect is generally represented by Expression 1.

$$d = \sqrt{\frac{2\rho}{\omega\mu}} \quad \text{[Expression 1]}$$

where $\rho$ is the electrical resistivity of the first and second low-resistance films 231_3 and 232_3, $\omega$ is the angular frequency of the current flowing through the first and second electrodes 231 and 232, and $\mu$ is the absolute permeability of the first and second low-resistance films 231_3 and 232_3.

When the film thicknesses of the first low-resistance film 231_3 and the second low-resistance film 232_3 are larger than d, an eddy current is generated in the first low-resistance film 231_3 and the second low-resistance film 232_3 with respect to a high-frequency current. When the eddy current is generated, there is a risk that drift of the beam B occurs due to changes in the magnetic field and that the deflection accuracy deteriorates as described above. Therefore, it is preferable that the film thicknesses of the first low-resistance film 231_3 and the second low-resistance film 232_3 are equal to or smaller than d. For example, when the first and second low-resistance films 231_3 and 232_3 are gold (Au) and the frequency of the current is 1 GHz, d is about 2.3 µm. In this case, the current flows through a surface layer portion to a depth of about 2.3 µm from the surfaces of the first and second electrodes 231 and 232. Therefore, it is preferable that the film thicknesses of the first low-resistance film 231_3 and the second low-resistance film 232_3 are equal to or lower than 2.3 µm. More preferably, the film thicknesses of the first low-resistance film 231_3 and the second low-resistance film 232_3 are set to, for example, be equal to or lower than 0.2 µm (for example, 0.1 µm to 0.2 µm). In this case, the current due to a high-frequency signal reliably flows through the whole of the first and second low-resistance films 231_3 and 232_3 that are low in the resistance while the current hardly flows in the first material film 231_2 and the second material film 232_2 that are relatively high in the resistance and the base materials 231_1 and 232_2 that are insulators. Therefore, by setting the film thicknesses of the first low-resistance film 231_3 and the second low-resistance film 232_3 to be equal to or lower than 0.2 µm, the current is reliably enabled to flow through the whole of the first low-resistance film 231_3 and the second low-resistance film 232_3 while being prevented from flowing in the first material film 231_2 and the second material film 232_2. As a result, the blanking deflector 212 can suppress the eddy current to stabilize the magnetic field in the blanking control with a high-frequency signal and improve the deflection accuracy of the beam B.

(Consideration Based on Ohm's Law of Low-Frequency Signal)

When the blanking control is executed with a high-frequency signal, most of the current flows through the first and second low-resistance films 231_3 and 232_3 due to the skin effect. On the other hand, when the blanking control is executed with a low-frequency signal (for example, a low-frequency pulse signal of about 1 MHz), the current tends to flow through both the first and second low-resistance films 231_3 and 232_3 and the first and second material films 231_2 and 232_2 according to the Ohm's law.

Figure 4:
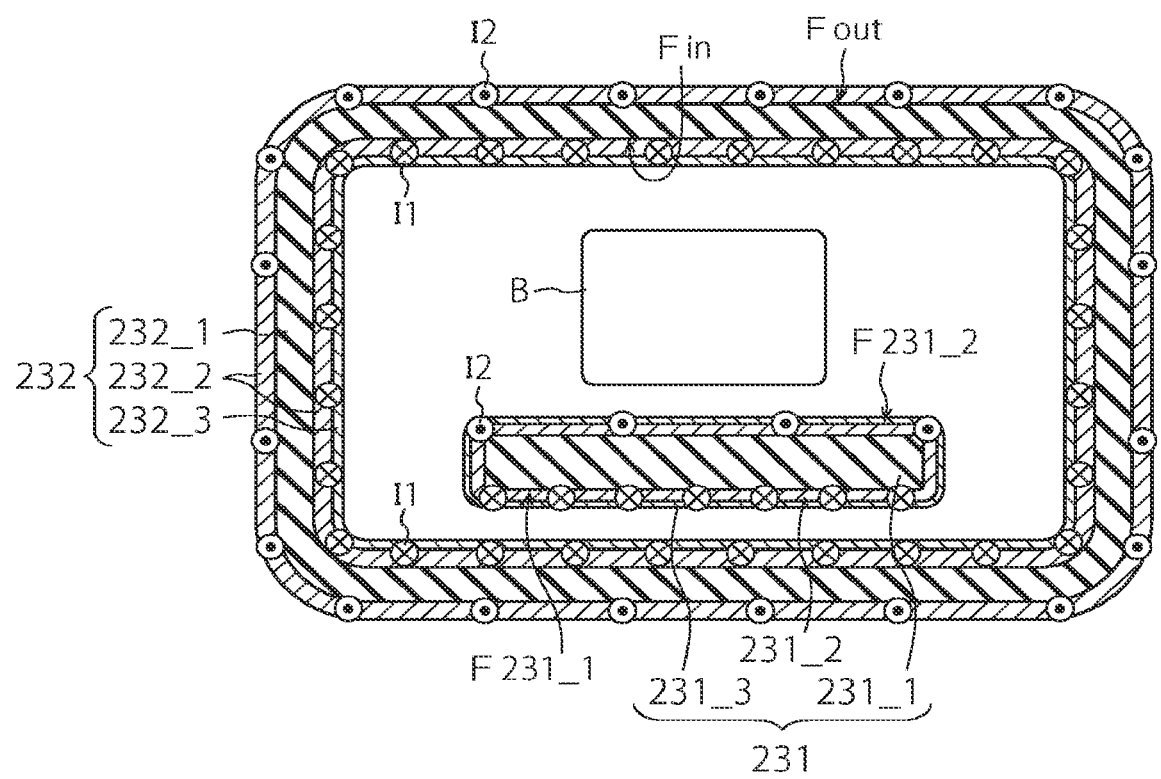
FIG. 4 is a conceptual diagram illustrating a flow of the eddy current.

With a low-frequency signal, an eddy current is generated to keep the current density constant. FIG. 4 is a conceptual diagram illustrating a flow of the eddy current. I1 denotes, for example, a current flowing in a downward direction of the drawing of FIG. 4. I2 denotes, for example, a current flowing in an upward direction of the drawing of FIG. 4. When the blanking amplifier 41 seeks to pass the current I1, the current I2 as the eddy current tends to flow in the opposite direction to that of the current I1.

In an example illustrated in FIG. 4, the current I1 in the first electrode 231 flows through the first material film 231_2 and the first low-resistance film 231_3 provided on one face (a face closer to the second electrode 232) F231_1 of the first electrode 231. The current I2 as the eddy current flows through the first material film 231_2 and the first low-resistance film 231_3 provided on the other face (a face far from the second electrode 232) F231_2 of the first electrode 231. In this way, the current density is sought to be kept constant in the first electrode 231. In the second electrode 232, the current I1 flows through the second material film 232_2 and the second low-resistance film 232_3 provided on the inner side surface Fin of the second electrode 232. The current I2 as the eddy current flows through the second material film 232_2 provided on the outer side surface Fout of the second electrode 232. In this way, the current density is sought to be kept constant in the second electrode 232.

Generally, such an eddy current destabilizes the magnetic field by the blanking control with a high-frequency signal and by the blanking control with a low-frequency signal, and deteriorates the deflection accuracy.

In the present embodiment, in contrast thereto, the base materials 231_1 and 232_1 are insulators and the first and second material films 231_2 and 232_2 are formed of materials higher in the resistance than the first and second low-resistance films 231_3 and 232_3, respectively.

The first and second material films 231_2 and 232_2 have such a level of resistance values (for example, equal to or lower than $10^6 \Omega$) that enable suppression of charge-up of the base materials 231_1 and 232_1 as described above. Meanwhile, the first and second material films 231_2 and 232_2 are formed of materials higher in the resistance than the first and second low-resistance films 231_3 and 232_3. For example, when the materials of the first and second low-resistance films 231_3 and 232_3 are gold or platinum (about 2 µΩ), cupper or aluminium, the materials of the first and second material films 231_2 and 232_3 are, for example, carbon, titanium, or titanium nitride (about 20 µΩ). This enables most of the current I1 to flow through the first and second low-resistance films 231_3 and 232_3 and can reduce the amount of the current flowing in the first and second material films 231_2 and 232_2 even by the blanking control with a low-frequency signal.

Experientially, when the current flowing in the first and second material films 231_2 and 232_2 is set to be equal to or lower than 1% of the entire current I1, the eddy current is suppressed and the deflection accuracy of the blanking control can be maintained even in the blanking control with a low-frequency signal.

Accordingly, the respective materials and film thicknesses of the first and second material films 231_2 and 232_2 and the first and second low-resistance films 231_3 and 232_3 are set so as to satisfy Expression 2.

$$\frac{i_H}{I} = \frac{r_L}{r_L + r_H} < 0.01 \qquad \text{[Expression 2]}$$

where I is the current flowing in the blanking deflector 212, $r_L$ is the resistance value of the first and second low-resistance films 231_3 and 232_3, $i_H$ is the current flowing through the first and second low-resistance films 231_3 and 232_3, and $r_H$ is the resistance value of the first and second material films 231_2 and 232_2.

For example, when the first and second low-resistance films 231_3 and 232_3 are gold having a film thickness of about 0.1 μm, the first and second material films 231_2 and 232_2 can be made of titanium having a film thickness of about 0.3 μm. This enables the current flowing through the first and second material films 231_2 and 232_2 to be equal to or lower than 1% of the entire current I1. The respective materials and film thicknesses of the first and second material films 231_2 and 232_2 and the first and second low-resistance films 231_3 and 232_3 are not limited thereto and any materials and film thicknesses that satisfy Expression 2 may be applied. It suffices that the first and second low-resistance films 231_3 and 232_3 have thicknesses in the order of sub-microns, for example, about 0.1 μm to 0.2 μm and the respective total film thicknesses of the first and second material films 231_2 and 232_2 and the first and second low-resistance films 231_3 and 232_3 need to be about 0.4 μm.

As described above, according to the present embodiment, insulators are used as the base materials 231_1 and 232_1, respectively, in the first and second electrodes 231 and 232. Accordingly, the current in the blanking control does not flow in the central portions of the first and second electrodes 231 and 232 and the eddy current is suppressed.

The first and second material films 231_2 and 232_2 substantially coat all the surfaces of the base materials 231_1 and 232_1, respectively. The first and second material films 231_2 and 232_2 have such film thicknesses that prevent the base materials 231_1 and 232_1 from being exposed and that satisfy Expression 2, respectively. The first and second material films 231_2 and 232_2 are made of a material being relatively high in the resistance and having a low level of conductivity. This can suppress the charge-up of the base materials 231_1 and 232_1. Furthermore, the first and second low-resistance films 231_3 and 232_3 are provided on the first and second material films 231_2 and 232_2 on the opposing faces of the first and second electrodes 231 and 232, respectively. The first and second low-resistance films 231_3 and 232_3 have film thicknesses that are equal to or lower than d according to Expression 1 and that satisfy Expression 2, respectively. The first and second low-resistance films 231_3 and 232_3 are respectively formed of precious metal materials significantly low in the resistance.

Therefore, the blanking deflector 212 according to the present embodiment causes most of the current to flow through the first and second low-resistance films 231_3 and 232_3 due to the skin effect in the blanking control with a high-frequency signal. Meanwhile, the blanking deflector 212 causes most of the current to flow through the first and second low-resistance films 231_3 and 232_3 according to the Ohm's law also in the blanking control with a low-frequency signal. As a result, changes in the eddy current and the magnetic field are suppressed in the blanking control both with a high-frequency signal and with a low-frequency signal and the deflection accuracy can be improved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A blanking deflector comprising:
a first electrode comprising a first insulator, a first material film coating all surfaces of the first insulator and having lower resistance than the first insulator, and a first low-resistance film coating part or all of surfaces of the first material film and having lower resistance than the first material film; and
a second electrode comprising a second insulator, a second material film coating all surfaces of the second insulator and having lower resistance than the second insulator, and a second low-resistance film coating part or all of surfaces of the second material film and having lower resistance than the second material film, wherein
the blanking deflector controls whether to irradiate a specimen with a charged particle beam by causing the charged particle beam to pass between the first electrode and the second electrode.

2. The deflector of claim 1, wherein the second low-resistance film is provided on an opposing surface facing the first electrode of surfaces of the second electrode and is not provided on a surface on an opposite side to the opposing surface.

3. The deflector of claim 1, wherein the first low-resistance film and the second low-resistance film are provided on surfaces facing each other of the first electrode and the second electrode, respectively.

4. The deflector of claim 1, wherein
the first electrode has a plate-like or rod-like shape, and
the second electrode has a tubular shape encompassing the first electrode.

5. The deflector of claim 4, wherein
the first low-resistance film is provided on all surfaces of the first electrode, and
the second low-resistance film is provided only on an inner side surface of the surfaces of the second electrode.

6. The deflector of claim 1, wherein
aluminium oxide is used as the first and second insulators,
carbon, titanium, or titanium nitride is used as the first and second material films, and
gold, platinum, copper, or aluminium is used as the first and second low-resistance films.

7. The deflector of claim 1, wherein
film thicknesses of the first and second low-resistance films are equal to or lower than d represented by Expression 1

$$d = \sqrt{\frac{2\rho}{\omega\mu}} \qquad \text{[Expression 1]}$$

where ρ is an electrical resistivity of the first and second low-resistance films, ω is an angular frequency of a current flowing through the first and second electrodes, and μ is an absolute permeability of the first and second low-resistance films.

8. The deflector of claim 1, wherein
the first and second material films and the first and second low-resistance films satisfy Expression 2

$$\frac{i_H}{I} = \frac{r_L}{r_L + r_H} < 0.01 \qquad \text{[Expression 2]}$$

where I is a current flowing through the first and second electrodes, $r_L$ is a resistance value of the first and second low-resistance films, $i_H$ is a current flowing through the first and second low-resistance films, and $r_H$ is a resistance value of the first and second material films.

9. A charged particle beam apparatus comprising:
a beam irradiation part configured to generate a charged particle beam to be emitted to a specimen; and
a first deflector comprising a first electrode and a second electrode and configured to cause a charged particle beam to be emitted to a specimen to pass between the first electrode and the second electrode and control whether to irradiate the specimen with the charged particle beam, wherein
the first electrode comprises a first insulator, a first material film coating all surfaces of the first insulator and having lower resistance than the first insulator, and a first low-resistance film coating part or all of surfaces of the first material film and having lower resistance than the first material film, and
the second electrode comprises a second insulator, a second material film coating all surfaces of the second insulator and having lower resistance than the second insulator, and a second low-resistance film coating part or all of surfaces of the second material film and having lower resistance than the second material film.

10. The apparatus of claim 9, wherein the second low-resistance film is provided on an opposing surface facing the first electrode of surfaces of the second electrode and is not provided on a surface on an opposite side to the opposing surface.

11. The apparatus of claim 9, wherein the first low-resistance film and the second low-resistance film are provided on surfaces facing each other of the first electrode and the second electrode, respectively.

12. The apparatus of claim 9, wherein
the first electrode has a plate-like or rod-like shape, and
the second electrode has a tubular or annular shape encompassing the first electrode.

13. The apparatus of claim 12, wherein
the first low-resistance film is provided on all surfaces of the first electrode, and
the second low-resistance film is provided only on an inner side surface of the surfaces of the second electrode.

14. The apparatus of claim 9, wherein
aluminium oxide is used as the first and second insulators,
carbon, titanium, or titanium nitride is used as the first and second material films, and
gold, platinum, copper, or aluminium is used as the first and second low-resistance films.

15. The apparatus of claim 9, wherein
film thicknesses of the first and second low-resistance films are equal to or lower than d represented by Expression 1

$$d = \sqrt{\frac{2\rho}{\omega\mu}} \qquad \text{[Expression 1]}$$

where ρ is an electrical resistivity of the first and second low-resistance films, ω is an angular frequency of a current flowing through the first and second electrodes, and μ is an absolute permeability of the first and second low-resistance films.

16. The apparatus of claim 9, wherein
the first and second material films and the first and second low-resistance films satisfy Expression 2

$$\frac{i_H}{I} = \frac{r_L}{r_L + r_H} < 0.01 \qquad \text{[Expression 2]}$$

where I is a current flowing through the first and second electrodes, $r_L$ is a resistance value of the first and second low-resistance films, $i_H$ is a current flowing through the first and second low-resistance films, and $r_H$ is a resistance value of the first and second material films.

17. The apparatus of claim 9, further comprising a blanking aperture comprising an opening at a central portion and configured to block the charged particle beam to the specimen, wherein
the charged particle beam is blocked by the blanking aperture when the first deflector deflects the charged particle beam, and
the charged particle beam passes through the opening of the blanking aperture to be emitted to the specimen when the first deflector does not deflect the charged particle beam.

18. The apparatus of claim 9, further comprising:
a shaping aperture configured to shape the charged particle beam; and
a second deflector configured to deflect the charged particle beam to irradiate a desired location of the shaping aperture with the charged particle beam.

* * * * *